(12) United States Patent
Han et al.

(10) Patent No.: US 11,878,299 B2
(45) Date of Patent: Jan. 23, 2024

(54) IMPRINTED SUBSTRATES

(71) Applicant: Illumina, Inc., San Diego, CA (US)

(72) Inventors: Hui Han, San Diego, CA (US); Dajun Yuan, San Diego, CA (US); M. Shane Bowen, Encinitas, CA (US)

(73) Assignee: Illumina, Inc., San Diego, CA (US)

( * ) Notice: Subject to any disclaimer, the term of this patent is extended or adjusted under 35 U.S.C. 154(b) by 304 days.

(21) Appl. No.: 17/169,181

(22) Filed: Feb. 5, 2021

(65) Prior Publication Data

US 2021/0170400 A1 Jun. 10, 2021

Related U.S. Application Data

(62) Division of application No. 15/700,731, filed on Sep. 11, 2017, now Pat. No. 11,020,739.

(Continued)

(51) Int. Cl.
*B01L 3/00* (2006.01)
*B29C 65/16* (2006.01)
(Continued)

(52) U.S. Cl.
CPC .... *B01L 3/502707* (2013.01); *B29C 65/1406* (2013.01); *B29C 65/1612* (2013.01);
(Continued)

(58) Field of Classification Search
None
See application file for complete search history.

(56) References Cited

U.S. PATENT DOCUMENTS 6,309,580 B1 * 10/2001 Chou .................. B29C 33/60
216/53
6,375,870 B1 4/2002 Msovsky
(Continued)

FOREIGN PATENT DOCUMENTS

CN 104515737 A 4/2015
EA 023986 B1 8/2016
(Continued)

OTHER PUBLICATIONS 17857180.8, "Extended European Search Report dated Feb. 28, 2020", Feb. 28, 2020, 8 pages.
(Continued)

*Primary Examiner* — Lore R Jarrett
(74) *Attorney, Agent, or Firm* — Dierker & Kavanaugh, P.C.

(57) ABSTRACT

Imprinted substrates are often used to produce miniaturized devices for use in electrical, optic and biochemical applications. Imprinting techniques, such as nanoimprinting lithography, may leave residues in the surface of substrates that affect bonding and decrease the quality of the produced devices. An imprinted substrate with residue-free region, or regions with a reduced amount of residue for improved bonding quality is introduced. Methods to produce imprinted substrates without residues from the imprinting process are also introduced. Methods include physical exclusion methods, selective etching methods and energy application methods. These methods may produce residue-free regions in the surface of the substrate that can be used to produce higher strength bonding.

7 Claims, 15 Drawing Sheets

Related U.S. Application Data

(60) Provisional application No. 62/400,332, filed on Sep. 27, 2016.

(51) Int. Cl.

| | | |
|---|---|---|
| *B29C 65/14* | (2006.01) | |
| *H01J 37/32* | (2006.01) | |
| *G03F 7/038* | (2006.01) | |
| *G03F 7/00* | (2006.01) | |
| *B81C 1/00* | (2006.01) | |
| *B32B 17/10* | (2006.01) | |
| *B32B 17/06* | (2006.01) | |
| *G03F 7/30* | (2006.01) | |
| *G03F 7/16* | (2006.01) | |
| *G03F 7/20* | (2006.01) | |

(52) U.S. Cl.
CPC .............. *B32B 17/06* (2013.01); *B32B 17/10* (2013.01); *B81C 1/0038* (2013.01); *G03F 7/0002* (2013.01); *G03F 7/038* (2013.01); *H01J 37/32009* (2013.01); *B01L 2200/12* (2013.01); *B01L 2300/0816* (2013.01); *B01L 2300/0877* (2013.01); *B01L 2300/0896* (2013.01); *B81C 2201/0153* (2013.01); *G03F 7/16* (2013.01); *G03F 7/2002* (2013.01); *G03F 7/30* (2013.01); *H01J 2237/3341* (2013.01)

(56) References Cited

U.S. PATENT DOCUMENTS

| | | | |
|---|---|---|---|
| 7,374,864 | B2 | 5/2008 | Guo et al. |
| 8,361,336 | B2 | 1/2013 | Okushima et al. |
| 2004/0250945 | A1 | 12/2004 | Zheng et al. |
| 2007/0023976 | A1 | 2/2007 | Kolesnychenko |
| 2007/0102293 | A1 | 5/2007 | Tai et al. |
| 2008/0011934 | A1 | 1/2008 | Verschuuren et al. |
| 2008/0096216 | A1 | 4/2008 | Quake et al. |
| 2009/0011943 | A1 | 1/2009 | Drmanac et al. |
| 2010/0104984 | A1 | 4/2010 | Shiobara et al. |
| 2010/0190654 | A1* | 7/2010 | Rothrock .............. B01L 3/5085 506/30 |
| 2010/0234674 | A1 | 9/2010 | Wheeler et al. |
| 2011/0042352 | A1 | 2/2011 | Okushima et al. |
| 2011/0052446 | A1 | 3/2011 | Hirano et al. |
| 2011/0273684 | A1 | 11/2011 | Owa et al. |
| 2011/0277922 | A1 | 11/2011 | Masudo et al. |
| 2012/0025419 | A1 | 2/2012 | Shiraishi et al. |
| 2012/0183752 | A1* | 7/2012 | Kodama ................ C08F 220/42 522/182 |
| 2012/0244243 | A1 | 9/2012 | Kobayashi |
| 2013/0116153 | A1* | 5/2013 | Bowen ................. C12Q 1/6844 506/26 |
| 2014/0246322 | A1* | 9/2014 | Katsumoto ........ G01N 15/1031 204/643 |
| 2014/0364819 | A1 | 12/2014 | Vandelden |
| 2015/0130069 | A1 | 5/2015 | Mahajan et al. |
| 2015/0336301 | A1 | 11/2015 | Kobrin et al. |
| 2016/0246170 | A1 | 8/2016 | Bowen et al. |

FOREIGN PATENT DOCUMENTS

| | | | | |
|---|---|---|---|---|
| EP | 1341655 | B1 | 10/2008 | |
| JP | 11118706 | A | 4/1999 | |
| JP | 2009194170 | A | 8/2009 | |
| JP | 2010103415 | A | 5/2010 | |
| JP | 2011061214 | A | 3/2011 | |
| JP | 2013516764 | A | 5/2013 | |
| JP | 2013219230 | A | 10/2013 | |
| JP | 2016072517 | A | 5/2016 | |
| KR | 1020100047268 | A | 5/2010 | |
| RU | 2478431 | C2 | 4/2013 | |
| TW | 200934635 | A | 8/2009 | |
| TW | 201622205 | A | 6/2016 | |
| WO | 2011090641 | A2 | 7/2011 | |
| WO | 2012014869 | A1 | 2/2012 | |
| WO | WO2015095291 | A1 * | 6/2015 | ............... G03F 7/00 |

OTHER PUBLICATIONS

Auner, C., et al., "Residue-free room temperature UV-nanoimprinting of submicron organic thin film transistors", Organic Electronics 10, 2009, 1466-1472.

Cheng, et al., "A combined-nanoimprint-and-photolithography patterning technique", Microelectronic Engineering 71, 2004, 277-282.

PCT/US2017/050937, "Search Report and Written Opinion dated Dec. 28, 2017", 25 pages.

* cited by examiner

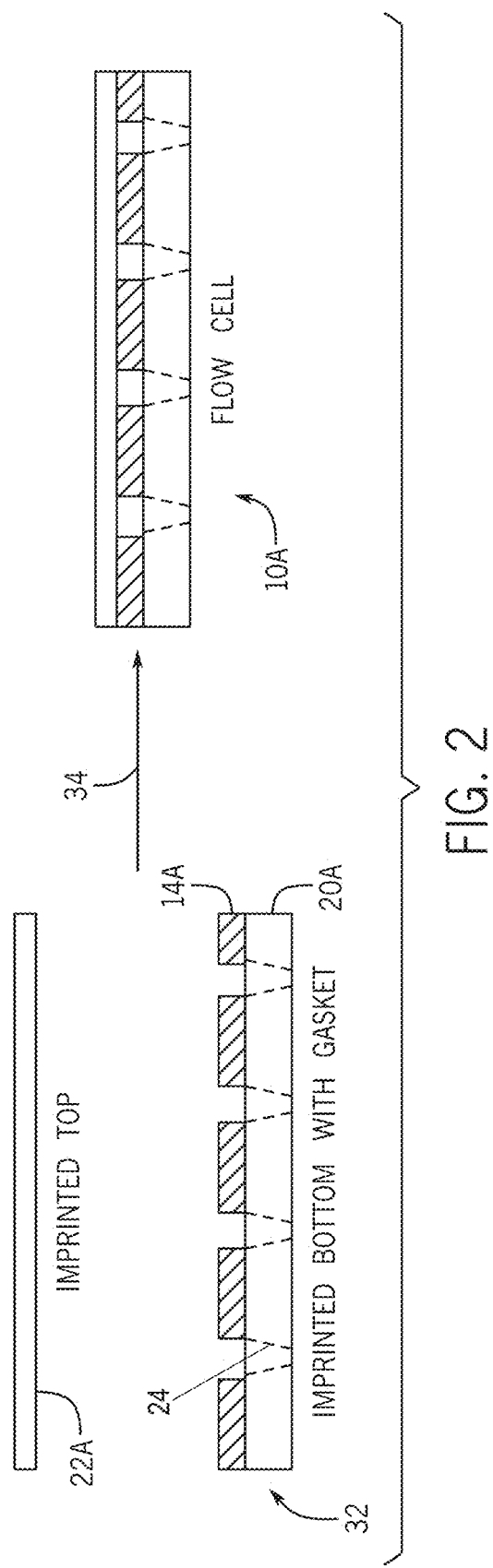

IMPRINTED SUBSTRATES

CROSS-REFERENCE TO RELATED APPLICATIONS

This application is a divisional of U.S. application Ser. No. 15/700,731, filed Sep. 11, 2017, which itself claims the benefit of U.S. provisional application Ser. No. 62/400,332, filed Sep. 27, 2016, the contents of each of which is incorporated by reference herein in its entirety.

BACKGROUND

The subject matter disclosed herein relates generally to the field of fabrication of flow cells for biochemical applications, and, more specifically, to the production of improved substrate surfaces for bonding and packaging.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Development of devices that automate the performance of molecular biology experiments have facilitated the acquisition of information through large scale studies. The performance of simultaneous experiments, for example, has led to several discoveries in biology. As an example, high throughput, automatic DNA sequencers enabled genome wide studies which facilitated the discovery of the genetic causes of several human conditions. To automate molecular biology experiments, these devices often employ flow cells with fluidic chambers where some of the chemical reactions take place. Depending on the application, the device may control the addition of reagents and the removal of products from the flow cell. The device may also be configured to monitor the reaction and collect associated data throughout the process. A common strategy to increase the throughput of such devices is to decrease the size of the chambers. This allows an increase in the number of chambers and, consequently, the number of simultaneous reactions performed in a single iteration.

SUMMARY

A summary of certain examples disclosed herein is set forth below. It should be understood that these aspects are presented merely to provide the reader with a brief summary of these certain examples and that these aspects are not intended to limit the scope of this disclosure. Indeed, this disclosure may encompass a variety of aspects that may not be set forth below.

Examples of this disclosure are related to the preparation of imprinted substrate surfaces for packaging and bonding and to the devices produced with the techniques. In some examples, substrate surfaces are prepared by imprinting techniques followed by removal of residues that may interfere with subsequent usage of the substrate. In other examples, imprinting techniques that produce surfaces with reduced amount of residue or substantially free of residue are presented. In further examples, fluidic devices produced with such techniques are disclosed.

In one example, a technique for production of a substrate employing a peeling technique is provided. In this example, a nanoimprinting lithography technique is followed by welding the residue to another layer in the regions where residue removal is desired and peeling the bonded gasket to remove most or all of the undesired residue and producing a region substantially free of residue.

In another example, a technique for production of a substrate employing an etching technique is provided. In this example, a protective photoresist is placed on top of nanoimprinted structures, and the photoresist as well as the undesired nanoimprint residue is etched away. In some implementations, the etching may employ plasma for reactive ion etching.

In a further example, a technique for production a substrate employing a low residue nanoimprinting technique is provided. In this example, the nanoimprint template employed in the nanoimprinting lithography is modified to generate regions of the substrate substantially free of residue without an additional or separate residue removal step. In some implementations, the nanoimprint template is further modified to allow easier flow of resin, facilitating the nanoimprinting process.

The disclosure also provides a flow cell containing chambers with imprinted nanostructures. The flow cell devices provided are produced with a high quality bonding, facilitated by the residue-free or reduced residue imprinted substrates generated. As a result, the flow cells contain chambers that are capable of resisting high pressures without leaking, and can be produced in a high throughput manner.

BRIEF DESCRIPTION OF THE DRAWINGS

These and other features and aspects of the present disclosure will become better understood when the following detailed description is read with reference to the accompanying drawings in which like characters represent like parts throughout the drawings, wherein:

FIG. 2 is an example of bonding of an imprinted substrate to produce a flow cell, according to examples of the present disclosure;

DETAILED DESCRIPTION

Figure 1B:
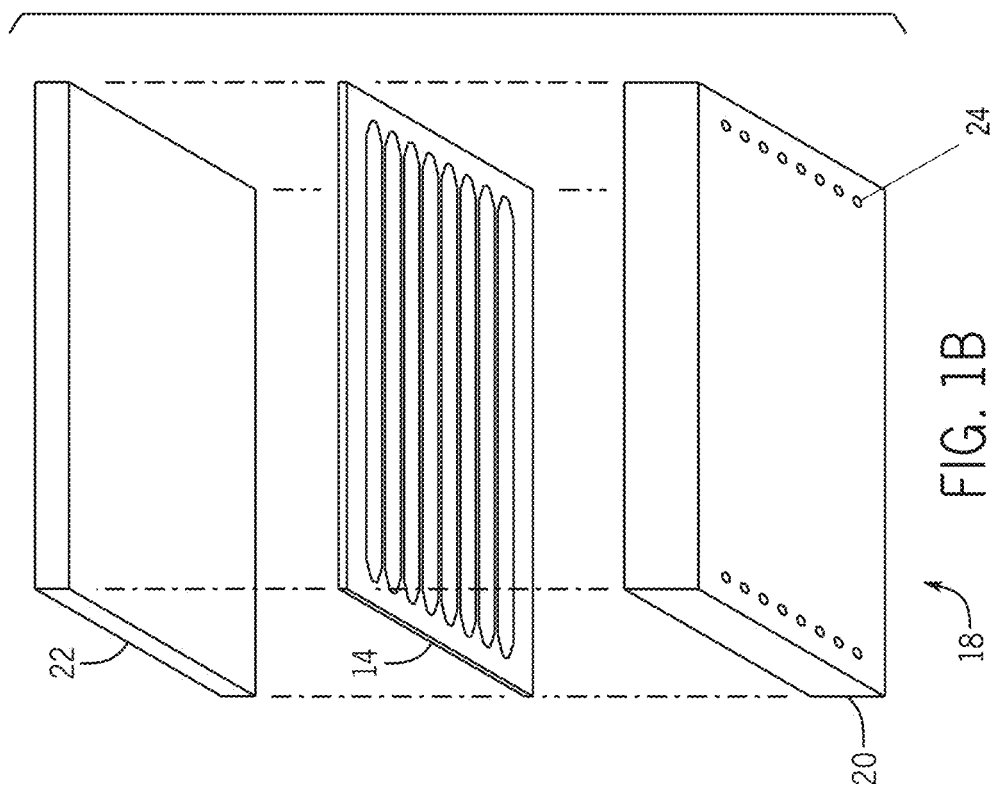
FIGS. 1A and 1B respectively illustrate an example of a flow cell chip and an exploded view of three constituent elements of the flow cell chip, according to examples of the present disclosure.

One or more specific examples will be described below. In an effort to provide a concise description of these examples, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Production of flow cells or other substrates that include nanoscale features may provide benefits for molecular biology, including for use in sequencing reactions. For example, miniaturization of structures may increase the number of chambers in a single flow cell chip, thus increasing the number of simultaneous reaction that can be performed in a single iteration of a reaction. Nanostructures produced via this miniaturization may also facilitate single molecule targeting or directed flow across a flow cell. In some applications, chemically treated nanostructures may be used to increase the surface-per-volume ratio of a chamber. One method to produce these miniaturized structures in a high throughput manner is to employ nanoimprinting lithography techniques. In nanoimprinting lithography, a pre-fabricated nanoscale template mechanically displaces a fluidic resin to mold the desired nanostructures. The resin is then cured with the nanoscale template in place. Following the removal of the nanoscale template, a molded solid resin attached to a desired substrate may be produced. In some applications, the cured resin may also be functionalized with a chemical treatment or an attachment of biomolecules, depending on the end use.

In certain examples, the molded solid resin may produce a channel, a chamber, a bump, a valley or any other desired structure in a region of the substrate destined to be an internal surface of a flow cell. To that end, the nanoimprinted substrate layer may be bonded to a gasket layer and/or to a second substrate layer to generate a sealed flow cell defined by a volume region between the substrates and/or the gaskets. However, bonding of the nanoimprinted layer may involve stringent requirements for the bonding regions of the surfaces. Resin residues, such as the ones that are usually found after nanoimprinting lithography treatment, may remain on regions of the substrate surface used for bonding, thus affecting the adhesion quality. As a result, the sealing of the flow cell may be compromised.

Flow cells produced with compromised seals resulting from compromised substrate bonding may leak under pressure, which in turn may result in faulty data collection. The decreased integrity of the flow cell seal may also lead to contamination of the samples within the reactions chambers and/or cross-contamination between samples from neighboring channels in a flow cell chip, thereby compromising the analysis performed. Furthermore, leaks in the flow cell chip may lead to contamination of the processing device utilizing the flow cell chip itself, which may require down time due to maintenance, replacement of damaged parts or replacement of the processing device. In addition, faulty bonding during manufacturing may result in a lower manufacturing yield, as poorly-bonded substrates are usually discarded during various quality control steps during production. The decreased yield increases overall material costs, labor costs and manufacturing costs per fabricated flow cell device.

Resin residue from nanoimprinting lithography may also prevent reuse of the nanoscale templates in a high throughput manner, as detailed below. For example, when the template is removed after nanoimprinting lithography, any residual resin attached to the template itself may obscure the template pattern on subsequent resins nanoimprinted using that template. Accordingly, the presence of residue on the template may result in increased replacement rate of nanoscale templates and/or an additional template cleaning step, which in turn also increases manufacturing cost and complexity.

Provided herein are techniques for generation of substrates that permit improved bonding of nanoimprinted layers to one or more supporting structures, e.g., substrates and/or gasket layers. The disclosed techniques yield, in a high throughput manner, nanoimprinted layers containing bonding surface regions that are low in residue or substantially free of residue to facilitate an improved bonding. The nanoimprinted layers produced by the disclosed techniques include clean bonding surface areas that, in particular examples, satisfy the stringent standards that generate the desired high quality bond.

In some examples, substrate surfaces containing nanoimprinted regions with desired resin nanostructures and residue-free regions that may be used for bonding are produced. The quality of the edge between the two regions may affect the quality of the bond, the quality of the imprinted nanostructures and/or the quality of the packaged device itself. In some examples, the disclosed techniques may facilitate production of high quality edges between the nanoimprinted and the residue-free regions, which may increase the quality of the flow cell and reduce costs by reducing the amount of discarded material during quality control.

In some examples, the clean areas of the nanoimprinted layer generated by the disclosed techniques may be beneficial for subsequent surface chemistry, depending on the desired end use. In applications related to optics, imaging, light sensing or light probing, the residue-free region of the substrate may be desired due to preferred optical properties. In other examples, the residue-free region may be desired for enhanced electrical properties. The residue-free region may present significantly less friction, which may be useful in miniaturized mechanical devices.

Therefore, while the disclosed techniques are discussed in the context of flow cells or molecular biology devices, it should be understood that the techniques may be applied to other fields. For example, the disclosed techniques for generating nanoimprinted layers may be used for MEMS devices, optoelectronic devices, circuitry, semiconductor devices, nanoscale reactors, etc., or any other applications where a nanoimprinted surface with regions substantially free of residue may be desired.

As used herein, the singular forms "a", "and", and "the" include plural referents unless the context clearly dictates otherwise. Thus, for example, reference to "a cell" includes a plurality of such cells, and so forth. All technical and scientific terms used herein have the same meaning as commonly understood to one of ordinary skill in the art to which this disclosure belongs unless clearly indicated otherwise.

As used herein, the terms "support," "substrate," and "gasket" and/or grammatical variants thereof refer to any material that provides a substantially rigid structure, or to a structure that retains its shape rather than taking on the shape of a vessel to which it is placed in contact. The material can have a surface to which another material can be attached including, for example, smooth supports (e.g., metal, glass, plastic, silicon, and ceramic surfaces), as well as textured and/or porous materials. Some example substrate or gasket materials include acrylics, carbon (e.g., graphite, carbon-fiber), cellulose (e.g., cellulose acetate), ceramics, controlled-pore glass, cross-linked polysaccharides (e.g., agarose or SEPHAROSE® (available from GE Healthcare Life Sciences)), gels, glass (e.g., modified or functionalized glass), gold (e.g., atomically smooth Au(111)), graphite, inorganic glasses, inorganic polymers, latex, metal oxides (e.g., $SiO_2$, $TiO_2$, stainless steel), metalloids, metals (e.g., atomically smooth Au(111)), mica, molybdenum sulfides, nanomaterials (e.g., highly oriented pyrolitic graphite (HOPG) nanosheets), nitrocellulose, nylon, optical fiber bundles, organic polymers, paper, plastics, polacryloylmorpholide, poly(4-methylbutene), poly(ethylene terephthalate), poly(vinyl butyrate), polybutylene, polydimethylsiloxane (PDMS), polyethylene, polyformaldehyde, polymethacrylate, polypropylene, polysaccharides, polystyrene, polyurethanes, polyvinylidene difluoride (PVDF), quartz, rayon, resins, rubbers, semiconductor material, silica, silicon (e.g., surface-oxidized silicon), sulfide, bondable thermoplastic polyimide films (such as, for example KAPTON®, KAPTON® J and Black KAPTON® J (BKJ), available from DuPont), and polytetrafluoroethylene (PTFE, commercially available as TEFLON® from DuPont).

Substrates may be patterned, where a pattern (e.g., spots, pads, wells, posts, stripes, swirls, lines, triangles, rectangles, circles, arcs, checks, plaids, diagonals, arrows, squares, or cross-hatches) is etched, printed, treated, sketched, cut, carved, engraved, imprinted, fixed, stamped, coated, embossed, embedded, or layered onto a substrate. The pattern can include one or more cleavage regions or modified regions on the substrate.

As provided herein, a "residue-free" region may be a surface that is substantially free of residue from a nanoimprinting material, e.g., a resin. Residue-free surfaces may include surfaces that, by surface area, are at least 90% or 95% free of residue. Further, a residue-free region may be positioned with, or may be a portion of a larger bonding region or target region on a substrate. For example, if an undesired resin is removed from a target area (e.g., by peeling or etching), the remaining target area may have a reduced amount of surface area covered by the residue such that at least 50% of the surface area of the target area is resin free to facilitate later bonding steps. In one example, a residue-free region is created when a sufficient amount of residue is removed from a substrate to support high quality bonding with another layer. In another example, the removal steps may be repeated to generate a surface with an even further decrease in residue over the desired bonding or target region.

Figure 1A:
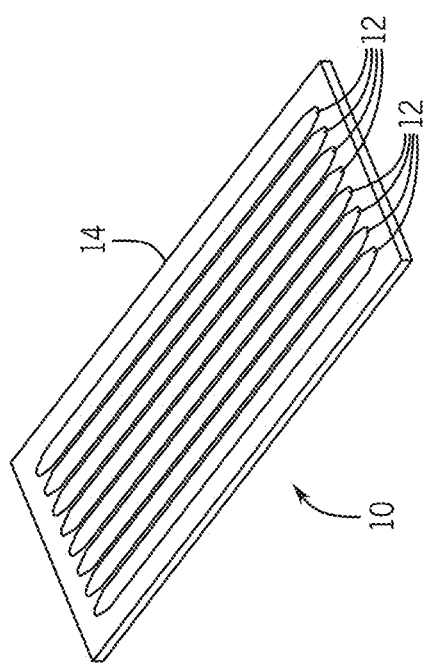

Referring to FIG. 1A, an example of a packaged flow cell device 10 is shown. The flow cell device 10 may be produced according to the disclosed techniques. In the flow cell device 10, a set of sealed chambers 12 is produced as a result of negative space in a gasket layer 14. The chambers 12 are sealed at the top and at the bottom by a substrate layer. This arrangement is illustrated in the exploded view 18 of the flow cell device 10, as shown in FIG. 1B. The gasket layer 14 is disposed between a bottom substrate layer 20 and a top substrate layer 22.

To produce a sealed chamber 12, the gasket layer 14 is usually bonded to the substrate layers 20 and 22. The bonding takes place in bonding regions of the substrate 20 or 22 and the gasket 14. The bonding regions may be located in the periphery of the flow cell device 10 which acts to seal the flow cell device 10 from external contamination. The bonding regions may, in one example, also be located between microfluidic sealed chambers 12 which, among other things, prevent cross-contamination within a flow cell device 10. However, it should be understood that the disclosed bonding regions may be located in any desired region depending on the implementation.

In some applications, the flow cell device 10 is used to perform controlled chemical or biochemical reactions in a reaction automation devices, such as in a nucleotide sequencer. If desired, ports 24 may be drilled through the bottom substrate layer 20. By connecting to ports 24, a reaction automation device may control the flow of reagent and products in the sealed chamber(s) 12. The reaction automation device may, in some applications, adjust the pressure, temperature, gas composition and other environmental conditions of the flow cell device 10. Further, in some applications not shown in FIGS. 1A and 1B, ports 24 may be drilled in the top substrate layer 22 or in both substrate layers 20, 22. In some applications, the reactions taking place in the sealed chamber(s) 12 may be monitored through the top substrate layer 22 and/or the bottom substrate layer 20 by imaging or measurements of heat, light emission and/or fluorescence.

In some applications, the sealed chamber 12 may contain imprinted nanostructures that are attached to the substrate layers 20 and/or 22. These imprinted structures may be produced through nanoimprinting lithography, photolithography, embossing, or other known techniques. In some designs, the height of the imprinted structures may be smaller than about one micron (μm) and the pitch (i.e., distance between structures) may range from about 400 nm to about 1 µm. In some applications, the substrate surface, the imprinted nanostructures and/or the gasket surfaces of the sealed chamber(s) 12 may contain added surface chemistry, as detailed below.

The diagram in FIG. 2 illustrates an example of a bonding step used in the production of flow cells 10. In this example, a lower layer 32 comprises a gasket 14A that is bonded to a bottom substrate layer 20A which, in some applications, may be imprinted, as discussed above. In this illustration, the lower layer 32 also has ports 24. A residue-free imprinted top substrate layer 22A, produced with one of the methods detailed below, is bonded to the lower layer 32 via a bonding step 34 to produce a packaged flow cell device 10A. In some implementations, the bonding step employs an IR laser. Other methods for bonding a gasket 14A to a substrate 20A, such as diffusion bonding, anodic bonding, eutic bonding, plasma activation bonding, glass frit bonding, or others methods known in the art that have stringent requirements on the bonding interface, are also contemplated by the methods described herein.

The quality of the bonding may be assessed by the strength of the bonding. The strength of the bond may be measured by a test that measures the adhesion directly. The snapping of the bond, as measured by any number of testing methodologies known to those of skill in the art, such as, for example snap testing described herein, is proportional to the bond strength. In such a test, a gasket or other material bonded to a substrate, or a substrate bonded to another substrate, is pulled. The present techniques allows adhesions strengths between glass substrates and/or gaskets on the order of 1000 gF (gram-Force) to over 3200 gF, as measured through the snapping of the bond test. Furthermore, since the quality of the bond is related the seal of the microfluidic chambers, the pressure supported by the chamber is another method to quantify the quality of the bond in the context of fabrication of fluidic devices. The present techniques allow the fabrication of chambers that support up to at least about 1 psi, about 2 psi, about 3 psi, about 4 psi, about 5 psi, about 6 psi, about 7 psi, about 8 psi, about 9 psi, about 10 psi, about 15 psi, about 20 psi, about 25 psi, about 30 psi, about 35 psi, about 40 psi, about 45 psi, or about 50 psi and up to at least about 100 psi for a sealed flow cell.

As discussed, the bonding strength of the assembled flow cell device 10A may be compromised by the presence of residue generated by earlier steps in the manufacturing process. For example, the nanoimprinting techniques used to generate the imprinted top substrate layer 22A or bottom substrate layer 20A may leave residue in place after the imprinting steps. The presence of such residue may yield flow cells with bonds having lower pull strengths, for example, the pull strength relative to a sealed flow cell may be lower. That is, the force used to break the bond (e.g., a gasket-substrate bond) of a compromised seal may be about 80%, about 50%, about 25%, or less than the force needed to break the same structural bond of a sealed flow cell 10, 10A. Such compromised bonds may not hold up during later manufacturing steps, leading to waste across the production cycle.

Figure 3:
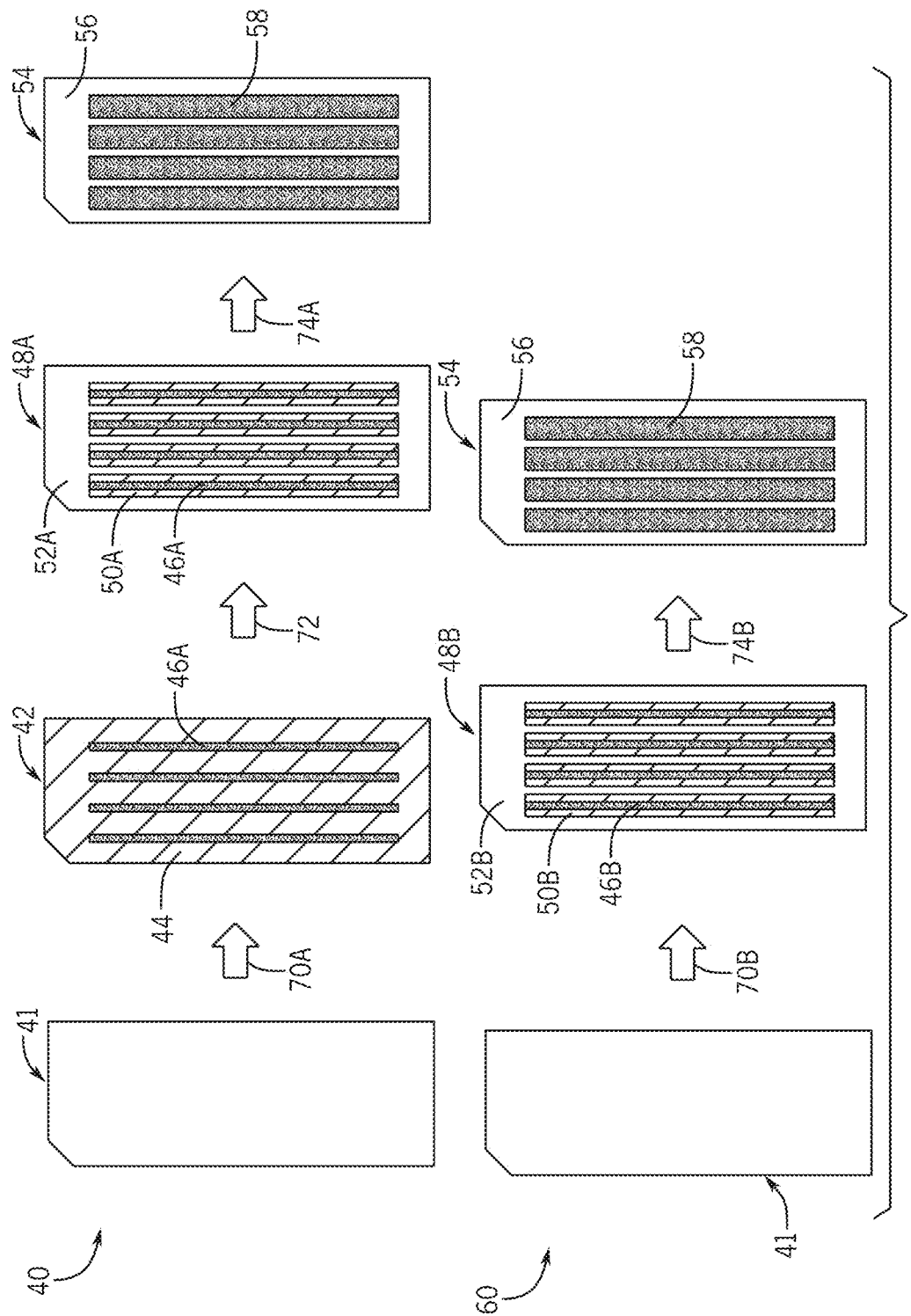
FIG. 3 is a schematic flow diagram of a method to produce packaged devices by bonding to residue-free surfaces, according to examples of the present disclosure.

To achieve nanoimprinted devices with desired bond strength, the nanoimprinted devices may be manufactured according to the implementations disclosed herein. The diagrams in FIG. 3 illustrate examples of the processing of substrates for nanoimprinting lithography and subsequent bonding as employed in some methods. The method 40 of processing and residue removal starts with a substrate 41. The chip 42 is produced after a nanoimprinting lithography step 70A. During imprinting, the substrate 41 or wafer might be completely covered with imprinting resin 44 along with the desired nanostructures 46A. By the end of the imprinting process, the resin 44 is cured against the substrate 41. Any suitable resin 44 may be used for nanoimprinting in the methods described herein. For example, the resin 44 may be an organic resin, such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallylphthalate resin. In some examples, the resin 44 employed may be an inorganic siloxane polymer including a Si—O—Si bond among compounds (including silicon, oxygen, and hydrogen), and formed by using a siloxane polymer-based material typified by silica glass as a starting material. The resin 44 employed may also be an organic siloxane polymer in which hydrogen bonded to silicon is substituted by an organic group, such as methyl or phenyl, and typified by an alkylsiloxane polymer, an alkylsilsesquioxane polymer, a silsesquioxane hydride polymer, or an alkylsilsesquioxane hydride polymer. Non-limiting examples of siloxane polymers include polyhedral oligomeric silsesquioxane (POSS), polydimethylsiloxane (PDMS), tetraethyl ortho silicate (TEOS), poly (organo) siloxane (silicone), and perfluoropolyether (PFPE). Note that the resin 44 may be doped with a metal oxide. The resin 44 may, for example, be a sol-gel material including, for example, titanium oxide, hafnium oxide, zirconium oxide, tin oxide, zinc oxide, and germanium oxide, and that uses a suitable solvent. Any one of a number of other resins 44 may be employed, as appropriate to the application. Further, while certain examples of the disclosure are discussed in the context of resins 44, it should be understood that the disclosed techniques may be used to remove undesired residue formed by other types of materials, e.g., polymer layers, adhesion promoters, metal films, semiconducting films, insulating films, etc.

A resin removal step 72 applied to a resin-coated chip 42 produces a residue-free bottom layer 48A. The resin removal step 72 involves a method to produce residue-free substrate surfaces. Examples of methods for resin removal are detailed below. The residue-free bottom layer 48A may be produced with chamber lanes 50A and nanostructures 46A, surrounded by residue-free region(s) 52A which, in some applications, is/are destined for bonding. In a bonding step 74A, a layer is applied to the top of the residue-free bottom layer 48A and a bonding technique is applied to the bond region 56. This results in a chip 54 with an imprinted substrate (e.g., residue-free bottom layer 48A) bonded to a second substrate or a gasket layer, and containing flow cell chambers 58.

In the method 60, shown below the method 40 for purposes of comparison, the production of a residue-free bottom layer 48B occurs directly from a modified nanoimprinting lithography step 70B, and therefore a resin removal step may be skipped. In some examples, the modified lithography step may include a low residue nanoimprinting technique, as detailed below. The modified lithography step 70b forms the residue-free bottom layer 48B, which may include chamber lanes 50B and nanostructures 46B, surrounded by residue-free region(s) 52B which, in some applications, is/are destined for bonding. In a bonding step 74B, a layer is applied to the top of the residue-free bottom layer 48B and a bonding technique is applied to the bond region 56. This results in a chip 54 with an imprinted substrate (e.g., residue-free bottom layer 48B) bonded to a second substrate or a gasket layer, and containing flow cell chambers 58.

With respect to methods 40 and 60, the substrate 41 may be a bottom substrate and the bonded layer may be a gasket layer in some examples. In these examples, the chip 54 may be a bottom layer 32 as illustrated in FIG. 2. In other examples, the substrate 41 may be a top substrate layer (e.g., 22A in FIG. 2) and the chip 54 may be a bottom layer 32 as illustrated in FIG. 2. In these examples, the product may be the sealed flow cell device 10A of FIG. 2. Steps of methods 40 and 60 may also be applied individually to produce other biochemical, optical or electronic devices in which production of nanoimprinted residue-free substrate surfaces and/or binding of these surfaces to other layers may be desired. Furthermore, the methods for production of a residue-free substrate surface mentioned above and detailed below may be applied in other applications, such as the production of contaminant-free microfluidic chambers or channels, cleaning for adhesive attachment, recycling of prior chambers, production of friction free surfaces, production of optically clear surfaces, removal of undesired dielectric materials, or any other situations where the removal of resin cured against a substrate is desired.

As noted above, the residue-free bottom layers 48A and 48B produced through methods 40 or 60 may have a residue-free region 52A, 52B and nanoimprinted chamber lanes 50A, 50B with features 46A, 46B. For adequate bonding strength, the bonding region 56 may consist of at least about 0.5%, at least about 1%, or at least about 5% of the total covered area of the substrate 41. In some applications, the bonding region 56 may be about 10%, about 20%, about 30%, about 40%, about 50%, about 60%, about 70%, about 80%, or up to about 90% of the total area of substrate 41. Furthermore, through some of the techniques presented, up to 99% of the bonding region 56 may be substantially residue-free. High quality bonding, as understood in this disclosure, may be performed in bonding regions 56 where areas of the bonding region 56 are substantially residue-free. In one example, the bonding region 56 may have a surface area that is at least about 50%, at least about 75%, at least about 90% or at least about 95% residue-free. As used herein, a residue-free region 52A, 52B may be part of a larger bonding region 56, and the residue-free region 52A, 52B may be discontinuous throughout the bonding region 56 as a result of patterns of residue removal. Moreover, the quality of the bonding in the region 56 between neighboring chamber lanes 50A, 50B may influence the spacing between the chambers. The high quality bonding resulting from the presented techniques may allow a spacing between the chambers as small as about 1 mm. That is, because the bonding strength/surface area is improved, a reduced amount of bonding surface area may be involved to achieve a high quality bond.

Figure 4:
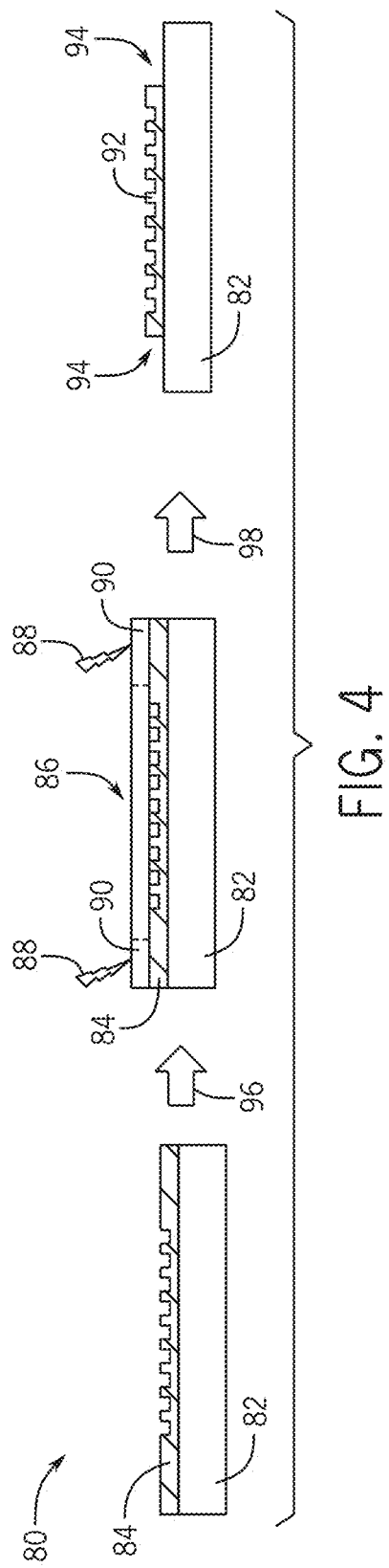
FIG. 4 is a schematic flow diagram of a method to produce residue-free imprinted substrate surfaces employing resin removal through peeling, according to examples of the present disclosure.

With the preceding in mind, the flow diagram of FIG. 4 illustrates an example of a peeling method 80 to remove a resin from desired regions of a substrate surface without leaving residue. An initial nanoimprinting lithography step, not illustrated, produces a substrate 82 attached to a cured resin 84 with nanostructures (e.g., the indentations and/or protrusions shown in cured resin 84). As described above, the surface of the substrate 82 may be completely covered by the nanoimprinted/cured resin 84 due to a spin coating, a spray or another technique usually employed during the application of nanoimprinting lithography. Therefore, areas where bonding to the substrate 82 may be desired are also covered in cured resin 84. To remove the cured resin 84 from these regions, a weld peel process may be applied. In some applications, the weld peel process generally consists of a welding or bonding of a substrate 82 to a layer, applied in regions where peeling or removal of the resin 84 from the substrate 82 is desired, followed by a removal of the welded layer.

During weld step 96 of the weld peel process, a layer 86 is added to the top of the cured resin 84, which is supported by the substrate 82. This layer 86 may be a gasket layer, sealing layer, or another substrate layer. Subsequently, an IR laser 88 is applied to target regions 90 to weld or bond the layer 86 to the cured resin 84 at the target regions 90. The target regions 90 are the regions of layer 86 that are in direct contact with regions of the cured resin 84 that are in direct contact with regions of the substrate 82 where a residue-free region (i.e., bonding region) is desired. In an example, the welding comprises a bonding technique employing applying energy to the bonding regions with an infrared (IR) laser.

In the peel step 98 of the weld peel process, the layer 86, including the regions of the cured resin 84 bonded or attached thereto, is removed, leaving the resin structure 92 attached to the substrate 82 and the residue-free surfaces or regions 94. In other words, the resin 84 previously bonded or attached to the substrate 82 in the target regions 90 is peeled off with the layer 86, leaving residue-free regions 94 (e.g., a bonding region that includes residue-free regions 94). In some examples, the layer 86 may be a polyimide layer or a rubber layer. Other layers may be used for this purpose.

In some implementations, a subsequent weld-peel process may be applied to decrease further the amount of resin 84 in the residue-free regions 94. A new layer 86 may the applied to the top of resin structure 92 and substrate 82, and a weld step 96 followed by a peel step 98 is performed.

In some other implementations of this method, the IR laser 88 may be applied directly to the resin 84 without the layer 86. Other techniques to deliver energy locally, such as UV lasers, or lasers in other regions of the spectrum, or focused heat, may also be employed for peeling.

Figure 5:
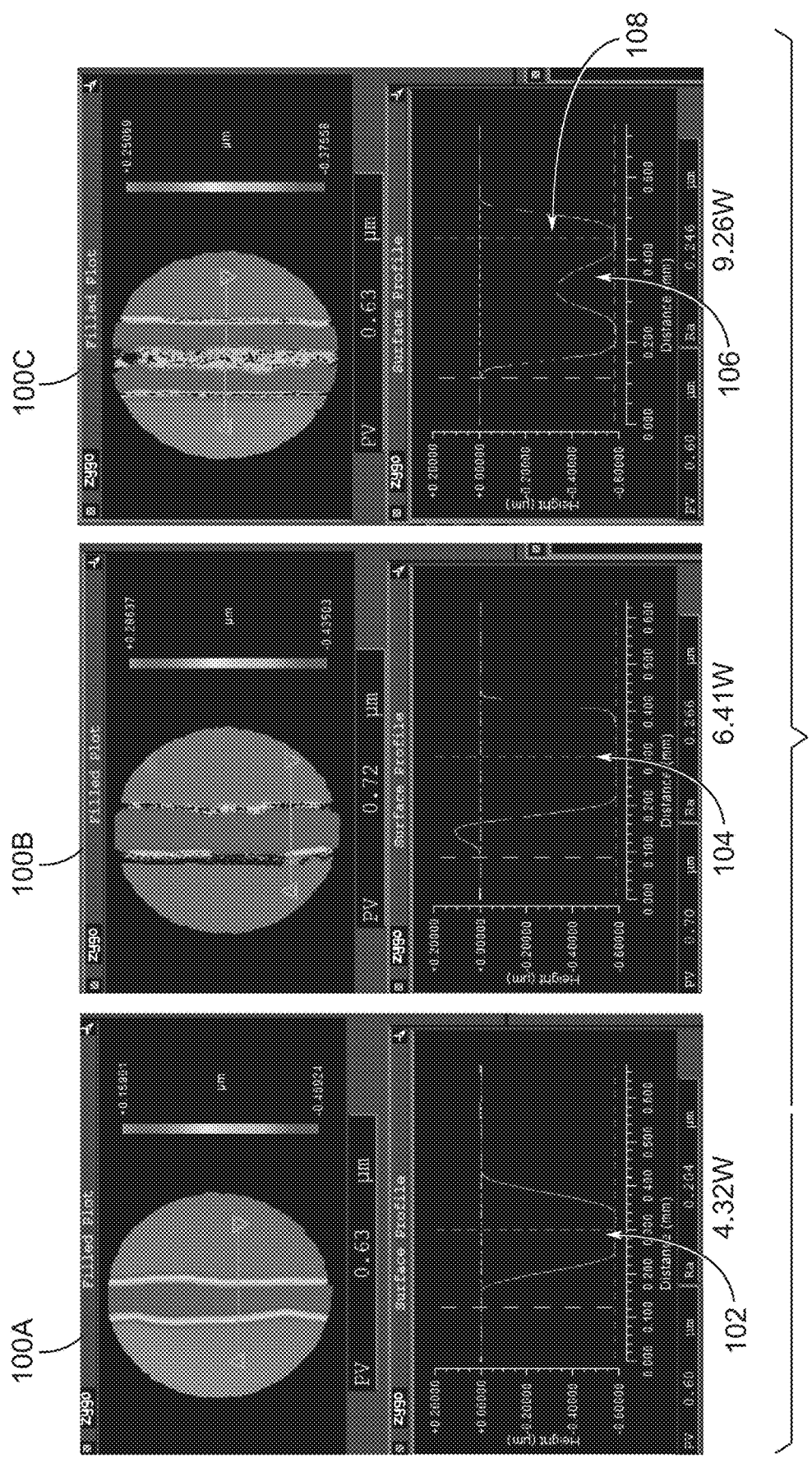
FIG. 5 shows results measuring the effects of the application of an infrared (IR) laser to resin surfaces, according to examples of the present disclosure.

As such, some examples of the peeling method employ the delivery of temperature or energy directly to the resin 84 to eliminate resin 84 residue. The charts in FIG. 5 illustrate the effect of the deposition of energy from a laser to a resin. For the data shown in the charts of FIG. 5, the laser scanned the resin surface at a speed of 250 mm/s. It was observed that the application of IR laser to a resin may lead to the formation of trenches (e.g., 102, 104, 106) in the resin. Chart 100A shows the formation of trench 102 formed by the application of an IR laser set to 4.32 W. In some applications, the depth of the trench is enough to reach a substrate layer beneath the resin. It was also observed that an increase in the laser power may lead to an enlargement of the trench. Chart 100B shows that as the laser power was increased to 6.41 W, the trench 104 became wider. An excessive increase in the laser power may lead to a burning of the resin, which may generate other hump-like structures. Chart 100C shows that increasing the laser further to 9.26 W generated a hump 106 in the wider trench 108. In some applications, a hump 106 may be undesired as it prevents the removal of residue. In some other applications, a hump 106 may be intentionally added to generate tiny structures within a trench in the resin layer with a potentially desirable texture.

The peeling efficacy may also be related to the energy density as well. When the level of energy deposited is low, little or no peeling is observed. At an intermediate level of energy, a peel type interface occurs, which may assist in the generation of residue-free regions. As used, herein, a peel interface is a trench formed where resin is removed by laser energy, or an area of a resin that has been removed upon exposure to energy. At an excessive level of energy, a burn interface occurs, which may be undesired. A burn interface is an area of a resin that has a hump formed in a trench as a result of energy exposure.

Figure 6:
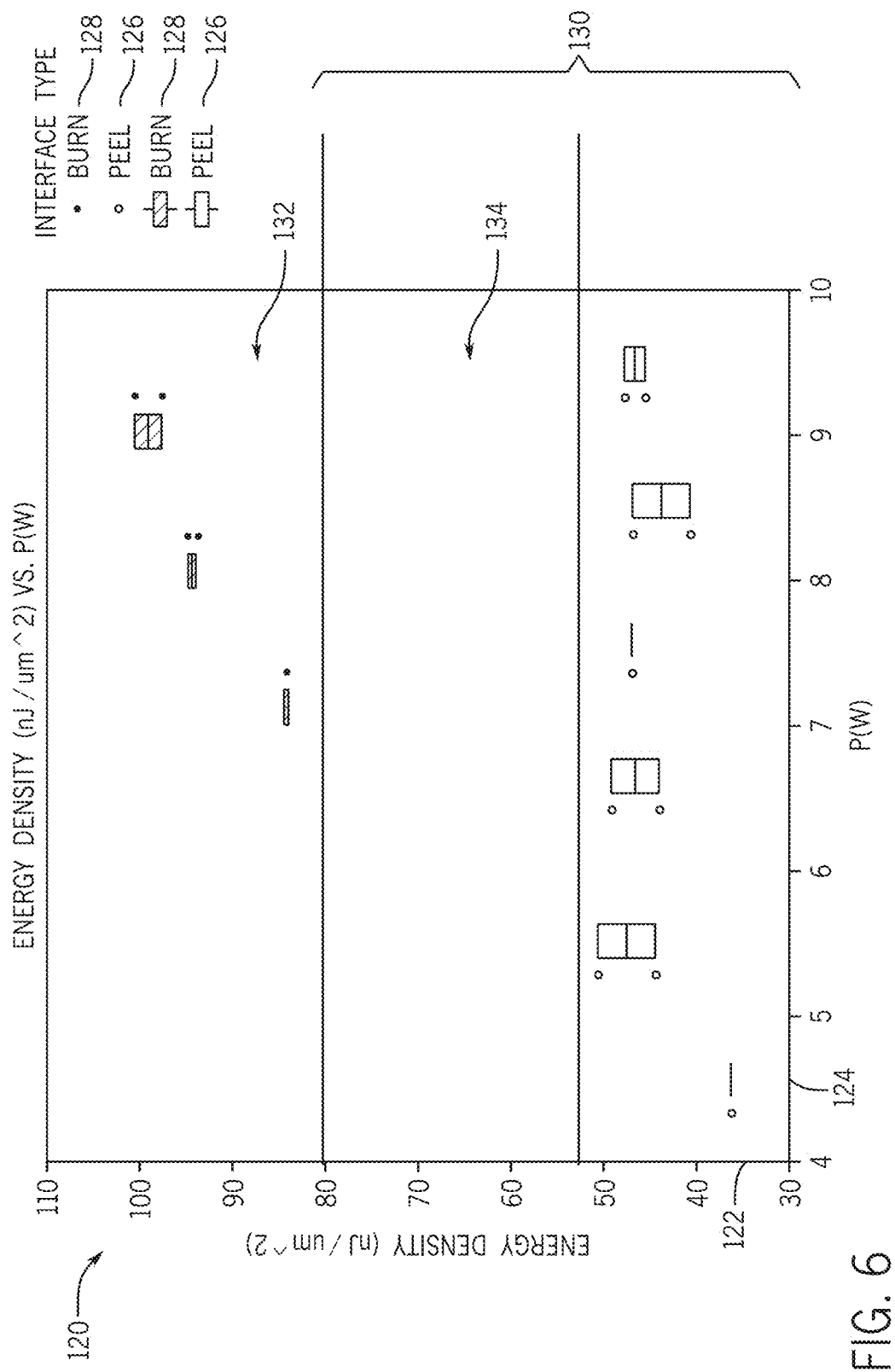
FIG. 6 is a chart illustrating the effects of different power settings and energy density settings on the application of an IR laser to resin surfaces, according to examples of the present disclosure.

The plot in FIG. 6 illustrates the effects of energy density deposition to the resin and the resulting interfaces that are formed. The plot 120 shows the result of the application of a laser to resin as a function of the energy density 122 and laser power 124. Note that the laser power 124 and the energy density 122 applied may be tuned substantially independently. This may be accomplished by changing the scanning speed of the laser or by adjusting the aperture of the laser, among other techniques. The result of each application of the laser was classified either as a peel interface 126 or a burn interface 128 based in part on the removal of material, the resulting texture, and/or the presence of a bump. The production of peel interfaces may occur at power settings ranging from 4.5 W to 9.5 W, as long as the energy density remains above 35 $nJ/\mu m^2$ and below 80 $nJ/\mu m^2$ (region 130). If the energy density is higher than 80 $nJ/\mu m^2$, burn interfaces 128 may appear (region 132), which may be undesirable in some applications. An optimum energy density region 134 may be used for removal of residue through the direct exposure peeling method. Note that the optimum values disclosed may vary due to the specific configuration of the equipment utilized.

Figure 7:
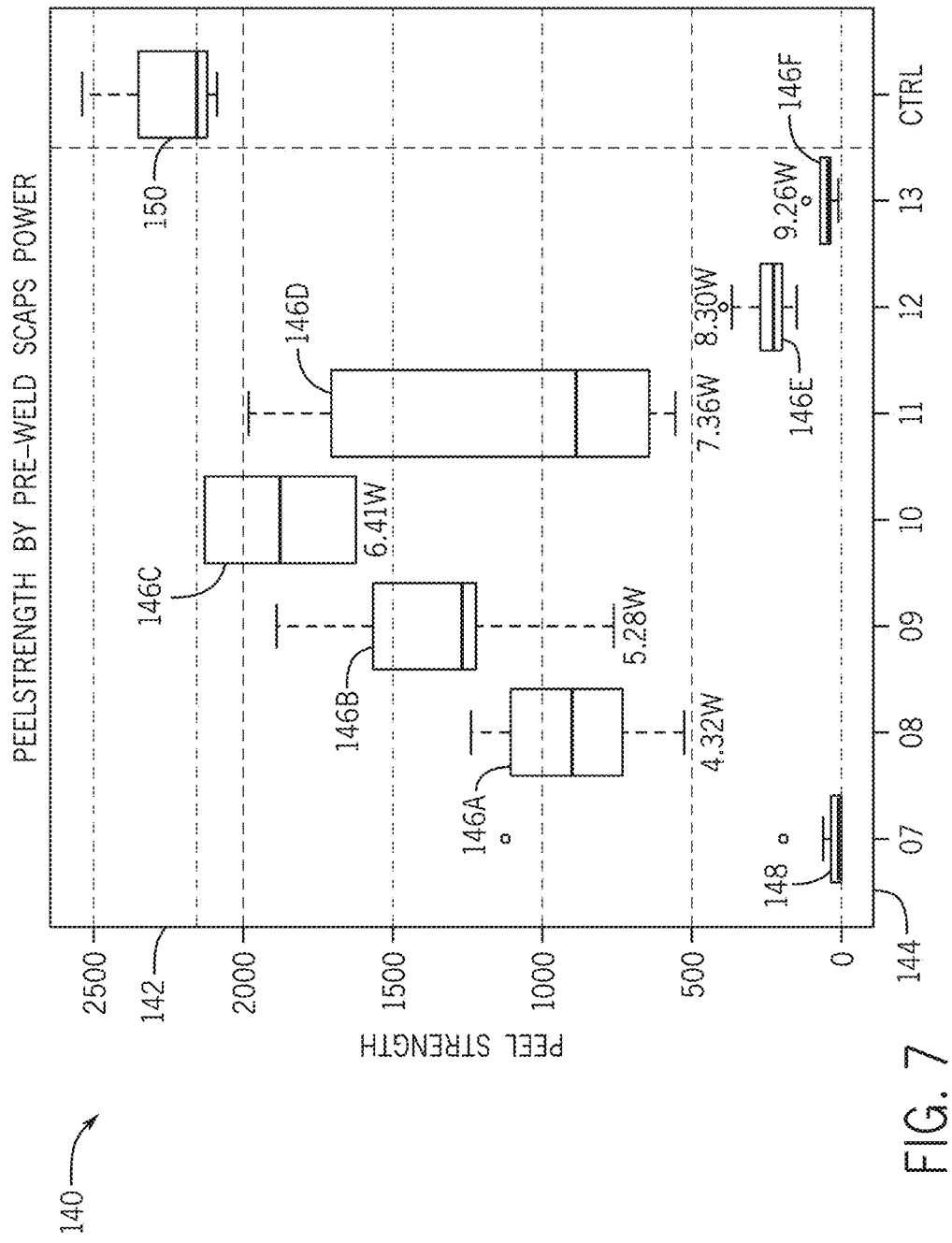
FIG. 7 is a chart illustrating the results of a bonding process performed on residue-free surfaces produced with a peeling method for resin removal, according to examples of the present disclosure.

The diagram in FIG. 7 illustrates the quality of bond in residue-free imprinted surfaces produced employing the peeling method. The strength of the bond produced 142 as a function of the specific treatment given 144 is provided. The datasets 146A-146F illustrate the result of this application. For a low power laser set at 4.32 W, the average peel strength of the bond 146A was about 750 gF. For a laser set at 5.28 W of power, the average peel strength obtained for the bond 146B was about 1250 gF. Based on this experiment, a maximum peel strength 146C of 1750 gF was obtained with a substrate that was treated with a laser with power set to 6.41 W. A further increase in the set power of the laser to 7.36 W decreased the peel strength 146D of the bond to about 750 gF. This decreasing trend continued as the bond obtained with a substrate treated with laser set at 8.30 W had a strength 146E of about 250 gF. The substrate treated with a laser set to 9.26 W had an average peel strength 146F of about 100 gF. Control dataset 148 shows that in the absence of the application of the peeling method, the bond was of very low quality, with a peel strength close to zero. A positive control dataset 150 shows a high bond strength of about 2200 gF, that was obtained when the bonding employs a non-imprinted substrate which is completely free of residue.

As is understood by one skilled in the art, the deposition of energy may depend on the specific instrument employed as well as the environmental conditions. Therefore, the optimum values of power and energy density illustrated above may change given the specific laser used, the specific method to measure strength, the specific method of welding employed, the substrate or gasket material, the resin material and/or the method employed to measure the produced features in the surface. Note, further, that the above description allows identification of optimum values for energy deposition via simple experimentation.

Figure 8B:
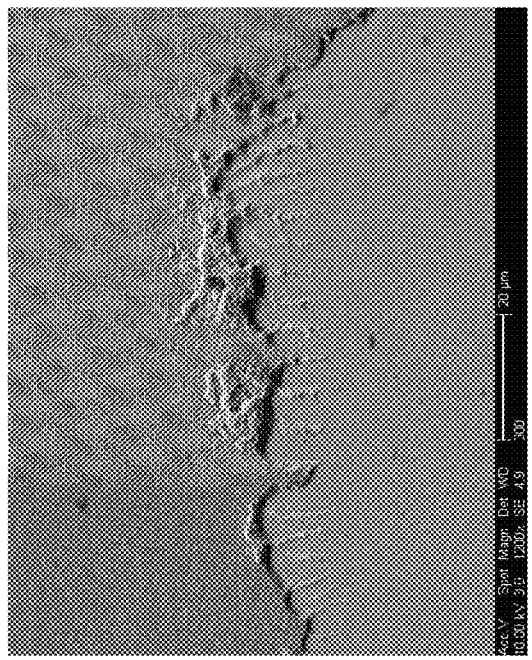
FIGS. 8A and 8B are respectively a photograph of a final packaged device produced with the peeling method and a scanning electron micrograph of an edge produced with the peeling method, according to examples of the present disclosure.
Figure 8A:
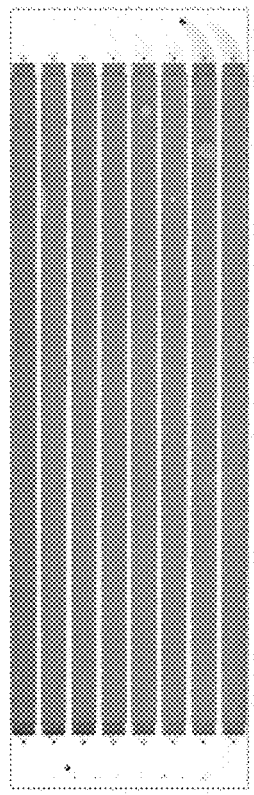

FIGS. 8A and 8B show an example of the packaged device (e.g., a flow cell chip) produced employing the peeling technique. The flow cell chip shown in image 160 of FIG. 8A, which was produced through the peeling method, illustrates the efficacy of the method in the production of a flow cell device. The image 160 shows the flow cell chambers filled and pressurized, and the bonding-regions free of any leaks. Furthermore, a scanning electron micrograph 170 of an edge of a residue-free region obtained through the peeling method is shown in FIG. 8A. This image 170 shows that the region below the edge is substantially resin-free, and therefore may be used to produce quality bonding.

Figure 9:
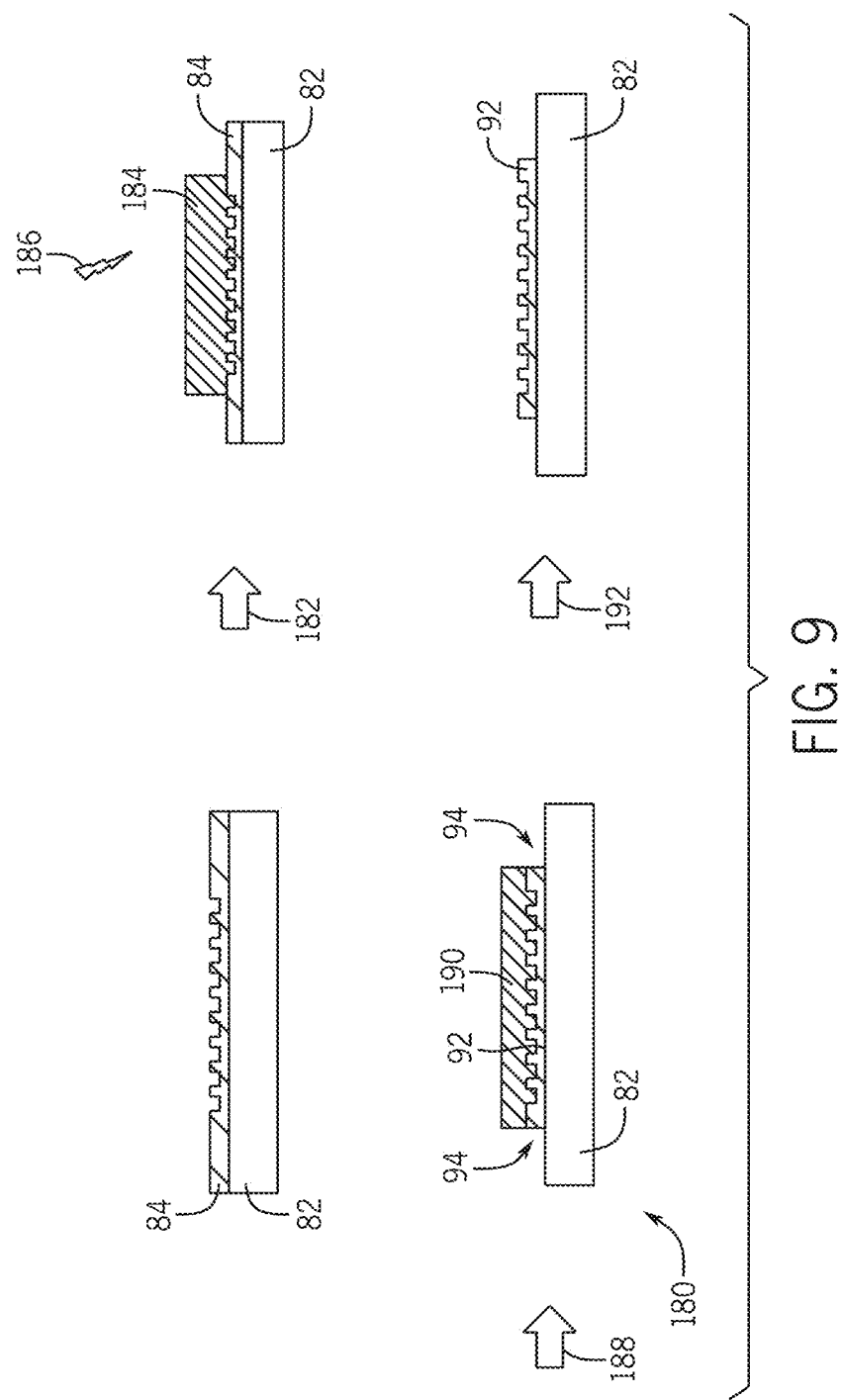
FIG. 9 is a schematic flow diagram of a selective reactive ion etching method to produce residue-free imprinted substrate surfaces, according to examples of the present disclosure.

The diagram in FIG. 9 illustrates a selective reactive ion etching method to produce residue-free surfaces after nanoimprinting lithography. A nanoimprinting lithography step produces a substrate 82 attached to a cured resin 84 with nanostructures. As noted above, the substrate 82 may be completely covered with the cured nanoimprinting resin 84. Through a photolithography step 182 employing conventional lithography, a protective photoresist 184 is patterned on top of the nanostructures of the cured resin 84. In some implementations, the photoresist will not cover regions of the resin 84 or of the substrate 82 where a bonding step will take place.

In some implementations, the photolithography step 182 begins with an initial coating of a photoresist material to the top of the cured, nanoimprinted resin 84 through a spin coating technique or other known techniques. In some applications, the photoresist material may be a NR-9 photoresist. For adequate coating, the photoresist may be solubilized in a photoresist solvent. Other available photoresists may be used as deemed appropriate for the application. In some implementations, the produced photoresist layer may be between about 0.5 µm and about 2.5 µm. Following the coating, a photomask is placed on top of the photoresist layer. In a positive photolithography process, the photomask may be transparent in regions where a photoresist is desired and opaque in regions where removal of the photoresist is desired. Conversely, in a negative photolithography process, the photomask may be opaque in regions where a photoresist is desired and may be transparent in regions where removal of the photoresist is desired. As noted above, the regions where a photoresist is desired may be the regions where protection of the resin is desired, and the regions where photoresist removal is desired may be regions where a residue-free region is desired.

Following the application and alignment of the photomask, baking may be employed. Baking may consist of placing the chip in a hot environment at around 80° C. for a specific time not more than 10 minutes. The chip is then exposed to an intense light in the photomask surface. In some applications, that intense light may be a UV light, but other light sources may be used, based on the specific photoresist material and developer employed. Note that the transparency and opaqueness of the photomask relates to the light applied during the photolithography. Regions of the photomask immediately underneath the transparent regions of the photomask may undergo a chemical transformation. Removal of the photomask, followed by a treatment of the photoresist with a developer may remove the photoresist from regions exposed to the light, in the case of a positive photolithography. In the case of negative photolithography, the treatment with a developer will remove the photoresist from the regions not exposed to the light. It should be understood that other photolithographic process may be employed to produce the developed protective photoresist 184 over desired regions of the imprinting resin 84.

Following the photolithography, an etching process may be applied. In some applications, a plasma 186 capable of reactive ion etching is applied. In usual applications of reactive ion etching, a charged plate may be placed underneath the substrate 82, and a grounded plate may be placed above the protective photoresist 184. The setup is then placed in a vacuum chamber, very low pressure (<100 mTorr) chamber, or some other chamber suitable for the formation of plasma 186. Low amounts of reactive etching gas are allowed in the chamber. In some applications, the gas may be a sulfur hexafluoride. Other reactive etching gases may be applied as is suitable for the etching application. An electric charge may be then applied to the charged plate underneath the substrate 82. In some examples, the charge may be an alternating current, high frequency charge. The charge may lead to ionization of the gas and formation of the plasma 186. This charge may also accelerate the ionized gas and plasma 186 in the chamber from the grounded plate towards the protective photoresist 184. The exposure of the surface of the protective photoresist 184 and of the unprotected regions of the resin 84 to the accelerated plasma ions may lead to corrosion of the surfaces, resulting in an etching.

As a result of this reactive ion etching step 188, the thickness of the photoresist 190 layer is reduced by the etching but protects part of the resin structure 92 where the desired imprinted structures are located. Unprotected areas of the resin 84 are etched leaving the residue-free substrate surfaces 94. A final stripping step 192, wherein the photoresist 190 is removed, produces a chip ready for bonding. In this step, a resist stripper solution may be applied. Other methods for stripping, such as treatment with other solvents or oxidation of the photoresist 190 may be used. Care must be taken so that the stripping reagents do not damage the substrate 82 or the desired resin structure 92.

The selective reactive ion etching method 180 may also be modified to employ other methods of etching. In some examples, a selective acid etching may be employed. In these applications, the photolithography step 182 is followed by treatment of the chip or wafer with an acid that corrodes the resin 84. In other applications, a wet etching employing an alkaline solution, such as a metal hydroxide, may be employed. Similarly to the acid etching, the photolithography step 182 is followed by a treatment of the chip with the alkaline solution. Other dry etching methods known may be used. Moreover, the choice of material for the resin 84 may be taken in consideration in the choice of the etching method.

The photoresist 184 remains in place before the end of the application of the plasma 186. Therefore, for a given reactive ion etching system, it is useful to know the difference of the etching rate of the protective photoresist 184 and the resin 84, and to select the thickness of the photoresist 184 accordingly. In some applications, the thickness of the removed resin layer is on the order of 100 nm while the thickness of the photoresist 184 is on the order of hundreds of microns. Note that when other etching methods are used, changes may be made to the material and/or the dimensions of the protective photoresist 184. Care should be taken such that the nanostructures in the resin 84 are protected from the etching.

For some applications, specific surface chemistry treatment may be desired in the surface of resin structure 92. This surface chemistry may be employed to create hydrophilic, hydrophobic or lipophilic surfaces. In some applications, the surface chemistry may be a hydrogel. The surface chemistry may be used for biocompatibility of the produced chamber with specific organisms. Furthermore, in applications involving cell lines of multicellular organisms, the surface chemistry may be used to provide appropriate molecular signals related to differentiation, growth, development or other desired phenotypical behavior of the cells. In some applications, the surface chemistry treatment may comprise attaching oligonucleotides to the resin for the purpose of detection, quantification or sequencing. These oligonucleotides may be DNA primers for complementation, short RNA sequences for hybridization, short double stranded DNA sequences, DNA sequences to anchor biomolecular origami or to provide a scaffold for other biomolecules, etc. In some applications, the surface chemistry may fix to the resin antibodies, nanobodies or other proteins and/or polypeptides that may facilitate the detection of other biomolecules. These proteins may assist the detection of biomolecules through affinity, hybridization or other interactions, such as in a FRET technique.

Figure 10:
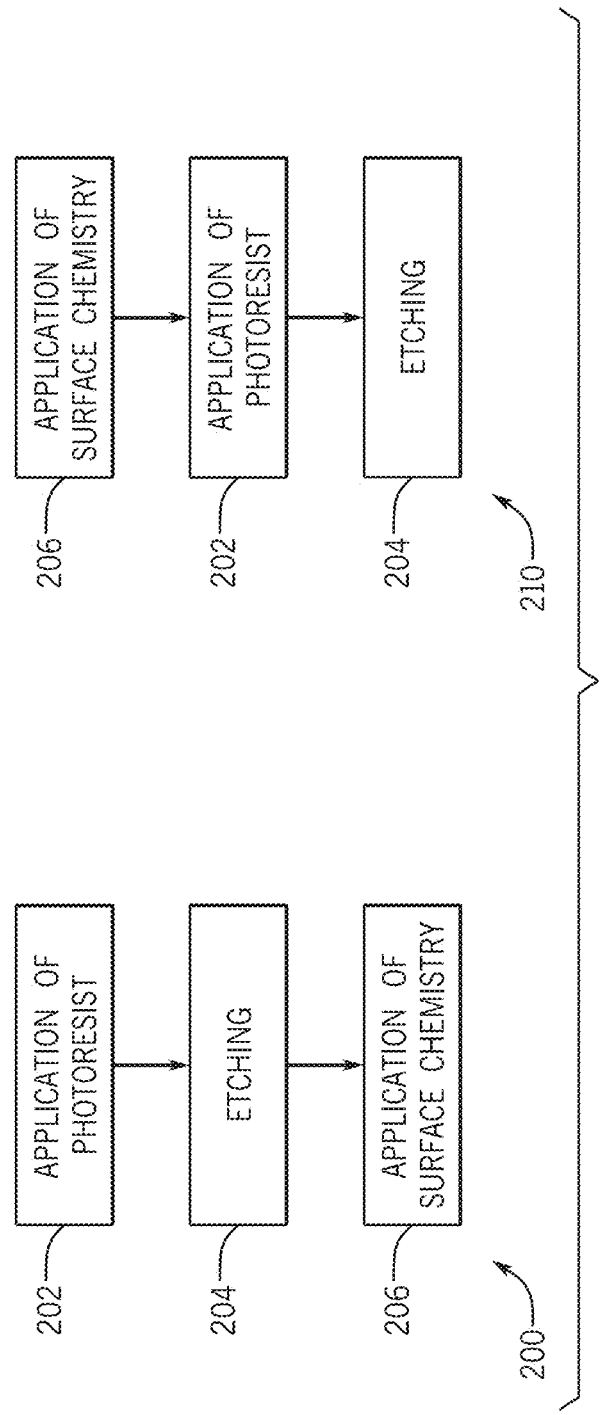
FIG. 10 depicts two flow charts for methods to produce residue-free imprinted substrate surfaces with desired surface chemistry using examples of the selective reactive ion etching method, according to examples of the present disclosure.

With the selective reactive ion etching method 180 of FIG. 9 in mind, FIG. 10 presents a flow chart 200 for an example of a method to provide the desired surface chemistry. After the application of a photoresist 184 (shown at reference numeral 202) and an etching treatment, (shown at reference numeral 204), the resin 84 may be treated to obtain surface chemistry (shown at reference numeral 206). As noted, the treatment that provides surface chemistry 206 takes place after the etching 204. The surface chemistry treatment 206 in this method may also extend to undesired regions of the chip, such as in residue-free areas. In some applications, this may decrease the bonding quality. In other applications, this may lead to contamination of the chambers in downstream applications. A polishing step, which removes surface chemistry applied to undesired regions, may be applied.

The presence of the protective photoresist 184 may allow an earlier application of the treatment that provides surface chemistry. The flow chart on the right in FIG. 10 presents an example of such method 210. In some examples, the treatment to obtain surface chemistry 206 takes place prior to the application of the photoresist 202 and subsequent etching treatment 204. As shown in FIG. 9, the protective photoresist 184 protects a region of the resin 84. It was observed that this protection also extends to different types of chemical treatment in the surface of the resin 84 as well. In the application of method 210, the selection of the photoresist material, photolithography light and resist stripping method may prevent damages to the surface chemistry applied. The early application of surface chemistry 206, as in method 210, is capable of producing residue-free regions that are also free of surface chemistry without the polishing. Consequently, method 210 may be used in the high throughput production of residue-free imprinted substrate surfaces with no additional polishing step.

Figure 11:
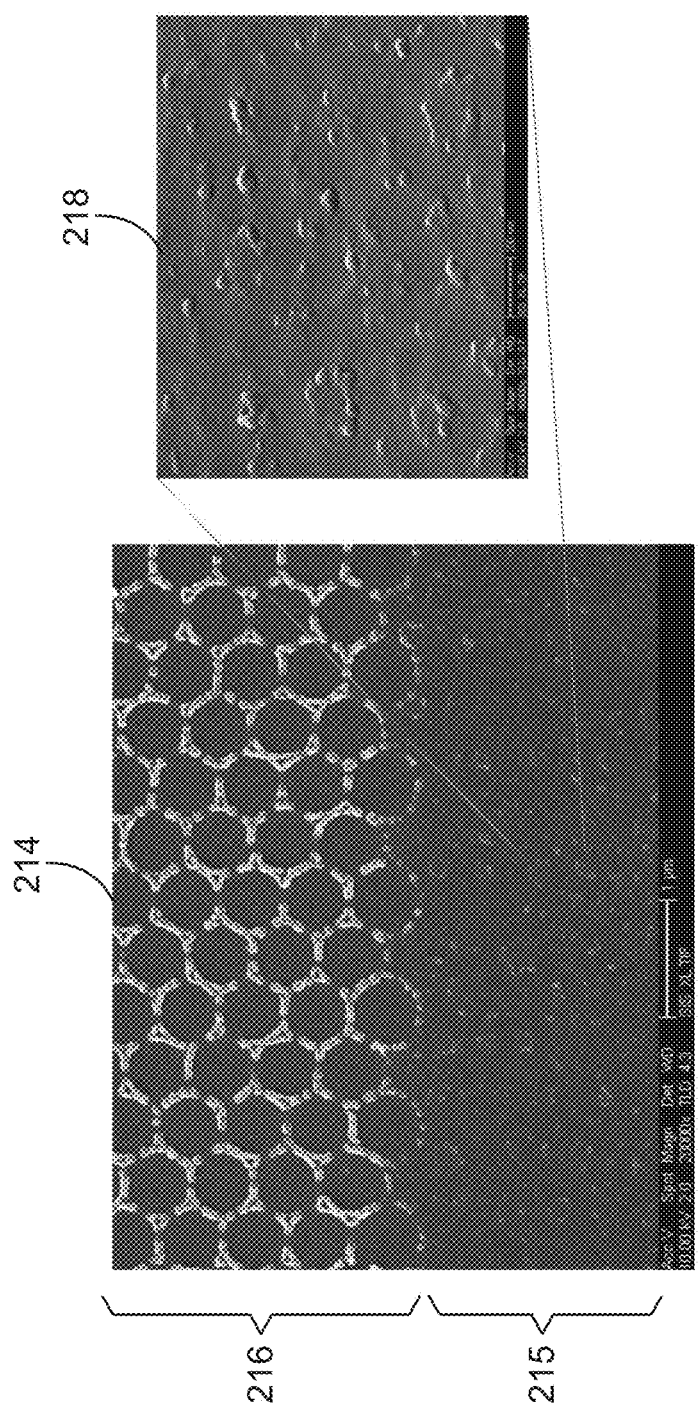
FIG. 11 depicts a scanning electron micrograph showing the removal of resin residue through a selective reactive ion etching method and an enlarged portion of the scanning electron micrograph, according to examples of the present disclosure.

The images in FIG. 11 show a scanning electron micrograph of a region of an imprinted substrate treated with a selective reactive ion etching. Micrograph 214 shows the removal of the resin in the etched area 215, which is significantly free of the cured resin. The micrograph 214 also shows that the polymeric structure of the cured resin in the protected area 216 is preserved. The enlarged portion of the image is shown at reference numeral 218, and this image 218 shows that, following the reactive ion etching, very little resin residue is left in the etched region.

Figure 12:
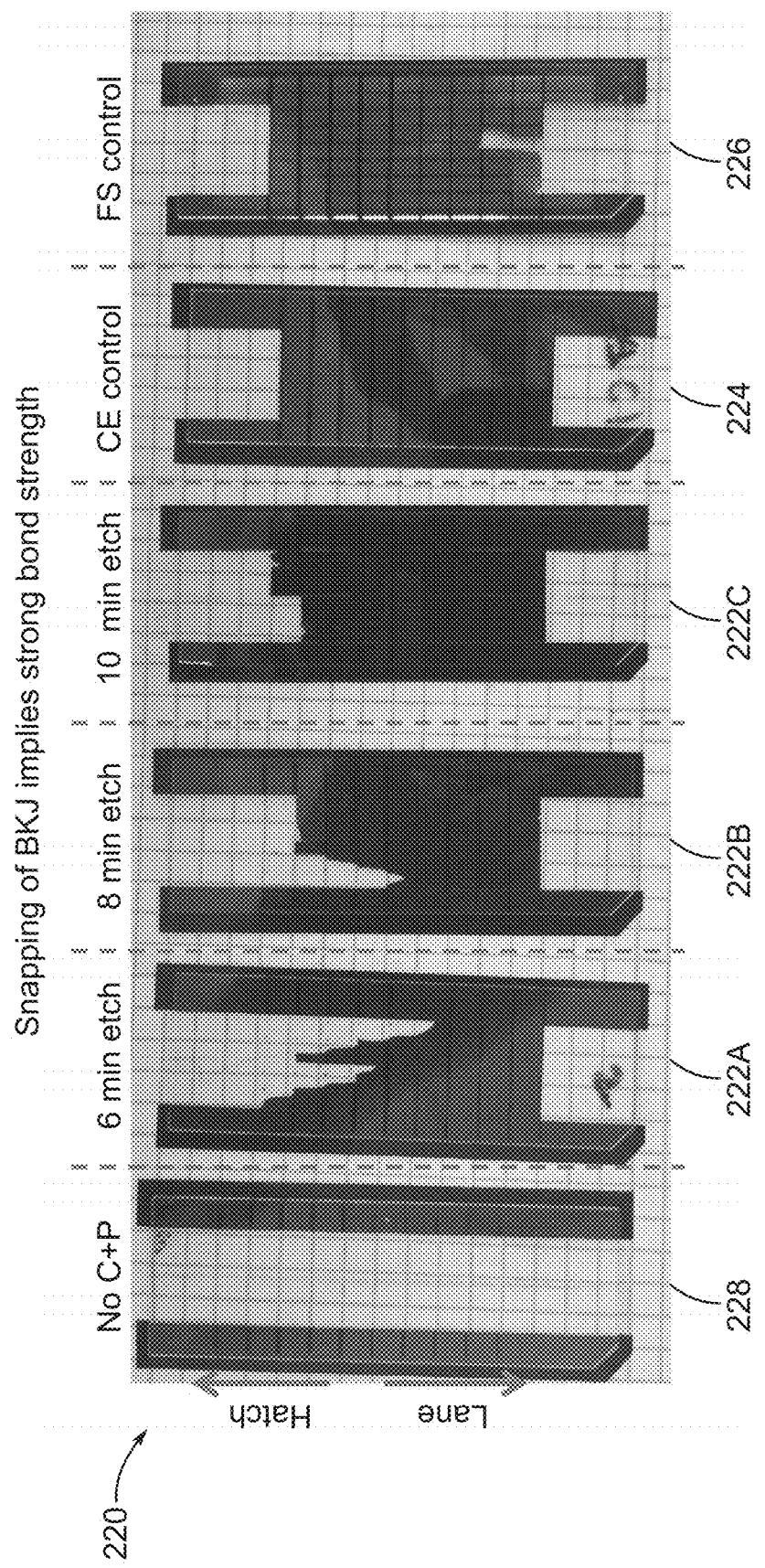
FIG. 12 is a photograph showing the results of a "snap test" performed on Black Kapton J (BKJ) bonded to residue-free surfaces produced with a selective reactive ion etching method, according to examples of the present disclosure.

It was observed that quality of the bond may be a function of the duration of the reactive ion etching treatment. That is, the longer the exposure to the etching plasma 186 (FIG. 9), the more resin residue may be eliminated from the target substrate surface. This results in a stronger bonding. Referring to FIG. 12, the image sequence 220 shows the results of a snap test to measure the bond strength between a polyimide gasket layer and an imprinted glass substrate. In this test, a gasket layer is bonded to tested substrate surfaces, and pulled. Briefly, the test is conducted as follows. A gasket layer bonded to a glass substrate is placed on the mounting plate of a digital force gauge, such as a MARK-10 Series 5 digital force gauge (MARK-10 Corp., Copiague, NY), and a free end of the gasket material is inserted into grip and pull testing is performed according to manufacturer's instructions.

In weak bonds, the gasket layer can be removed with very little resistive force (low peel strength). Stronger bonds lead to snapping of the gasket. The snapped area can be measured and a measurement of strength can be obtained. Image 222A shows the result of the snap test applied to a substrate surface after a reactive ion etching with a duration of 6 minutes. An increase in the duration of the etching to 8 minutes reduces the area of polyimide removed (222B). Further increase in the duration of the etching to 10 minutes leads to a further decrease of the snapped area (222C). The control 224 shows the original shape of the resin prior to the snap test for reference. The control 226 shows the result of the snap test on a non-imprinted substrate. Note that a non-imprinted substrate provides a very strong bond, which results in very little snapping. The control 228 shows that in the absence of etching, the bond quality decreases significantly leading to snapping of the polyimide in the entire surface. Such a decrease in bond quality is associated with poor bonding strength in conventional techniques in which the residue is insufficiently removed.

Figure 13B:
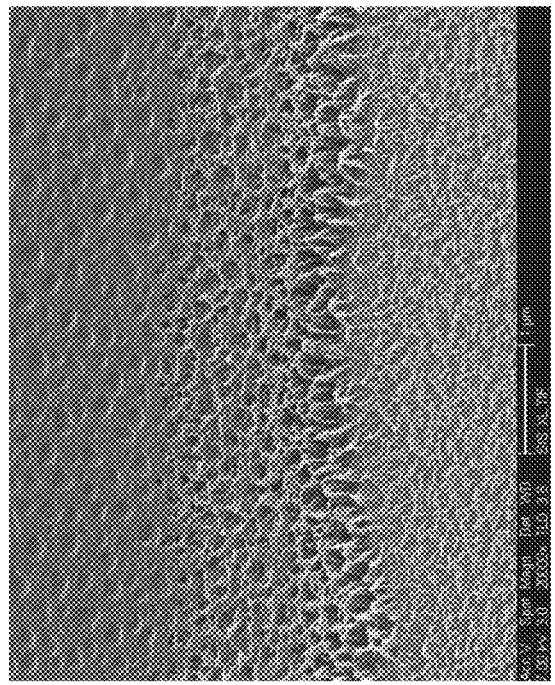
FIGS. 13A and 13B are respectively a photograph of a final packaged device produced with a selective reactive ion etching method and a scanning electron micrograph of an edge produced with a selective reactive ion etching method, according to examples of the present disclosure.
Figure 13A:
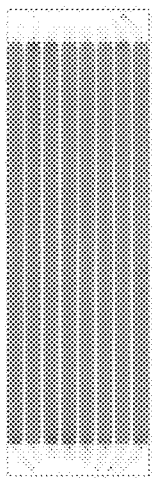

The images in FIGS. 13A and 13B show results of the reactive ion etching method. FIG. 13A depicts an image of a flow cell chip 230 produced through a reactive ion etching method, illustrating the efficacy of the method in the production of a flow cell device. The image in FIG. 13A shows the flow cell chambers filled, and the bonding-regions free of any leaks.

The scanning electron micrograph 240, shown in FIG. 13B, of an edge obtained through the reactive ion etching method shows that a high quality edge between the imprinted and the resin-free regions. The high quality edge leads to an increase in the yield of the fabrication, as it decreases the number of discarded imprinted substrates due to damage to the structures. Furthermore, the micrograph 240 also shows a substantially resin-free region below the edge which allows high quality bonding.

As discussed above, the techniques presented here employ a nanoimprinting lithography method to produce a resin attached to a substrate. In the nanoimprinting lithography, a nanoimprinting template, containing a mold for desired nanostructures is employed, as discussed below. A thin layer of a fluidic nanoimprint resin, such as polyimide resin, may be coated on the surface of the substrate. Application of the nanoimprint template to the layer physically displaces and molds the nanoimprinting resin. Subsequent curing of the resin by UV light, a heating-cooling cycle, or other appropriate method, may solidify the resin in the shape molded by the nanoimprint template. Removal of the template may then leave an imprinted substrate. In some applications, the nanoimprinting lithography method may be substituted for other embossing methods.

Figure 14:
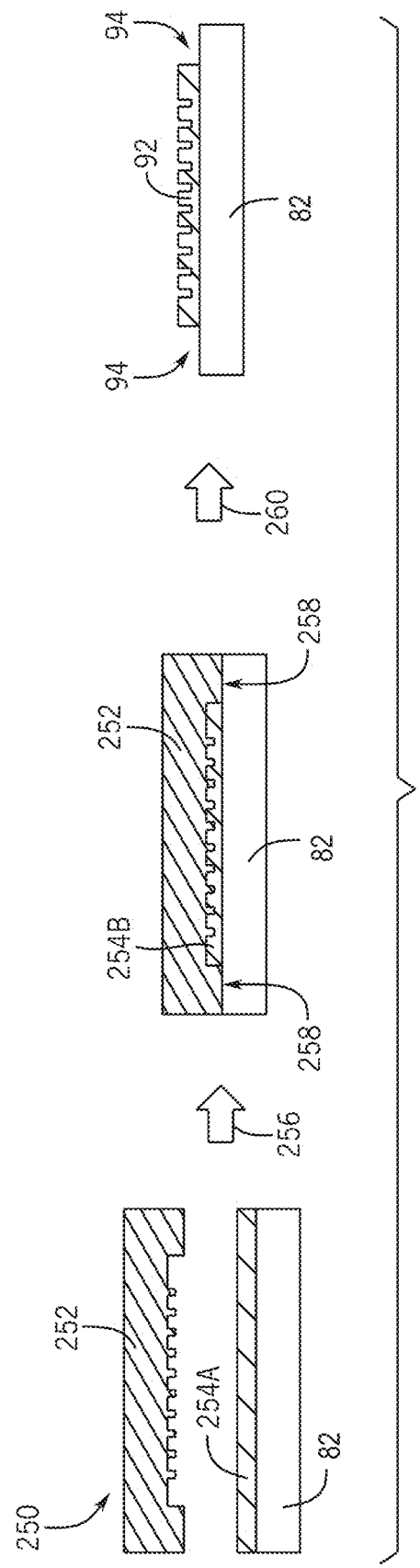
FIG. 14 is a schematic flow diagram of a low residue nanoimprinting method to produce residue-free imprinted substrate surfaces, according to examples of the present disclosure.

Referring back to method 60 of FIG. 3, a residue-free surface may be obtained without a resin removal step in certain examples, with a modification of the nanoimprinting template. The flow diagram in FIG. 14 shows an example of such a displacement-based low residue layer method 250. This method employs a modification of the nanoimprinting template 252 such that, in addition to molding desired nanostructures, the nanoimprinting template 252 may be designed such that it entirely displaces the resin from regions of the substrate 82, producing regions with substantially low residue after the nanoimprinting lithography.

In some applications, the height of the nanoimprinting template 252 in the bonding region may be increased beyond the height of the nanostructure features. This additional height allows, in some applications, a direct contact between the nanoimprinting template 252 and the substrate 82 during the pattern transfer step 256.

In some applications, the structure of the nanoimprinting template 252 in the bonding region may be designed to produce structures that have extra height to account for the displacement of some resin material by the nanoimprinting template 252. Any undesired height may be etched down in an additional step by selection of etching materials and/or time to yield channels with walls of a final desired height.

In some applications, special surface patterns such as channels or chambers that facilitate the displacement of the fluidic resin 254A may be added to the bonding region of the nanoimprinting template 252. For example, a channel may be formed in the nanoimprinting template 252 to permit exit of the resin 254A from the intended bonding region 258 during the pattern transfer step 256. In one example, the channel may include an exit port positioned outside of the residue-free regions 94. In such an example, the channel may be oriented generally parallel to the surface of the substrate 82. The nanoimprinting template 252 is pressured against the substrate 82 until it touches the substrate in the regions 258, displacing the resin layer 254A in the process. The resulting non-cured resin 254B is molded to form nanostructures attached to the substrate 82 and may be completely removed from the desired regions 258 by physical exclusion. As described above, a curing step 260 may solidify the resin 254B to produce nanostructures in resin structure 92.

After the curing step 260, removal of the nanoimprinting template 252 may leave the imprinted resin structure 92 attached to the substrate 82, forming the desired nanostructures. Furthermore, the regions where the nanoimprinting template 252 touched the substrate 82 become substantially residue-free areas 94 after the removal of the template 252. Since the resin 254A, 254B was removed from the regions 258 prior to curing (and thus was never present to be cured against the substrate 82 in the residue-free areas 94), a residue removal step may be skipped. Additionally or alternatively, a wash step may be included.

As discussed above, a nanoimprinting template 252 may be used in several fabrication iterations. However, in some implementations, residual resin in the resin layer 254A may be attached to the template 262 after the curing process. The residual resin in the template 262 may be responsible for failure in nanostructures present in some of the nanoimprinted substrates fabricated. Moreover, the presence of residual resin may obscure regions of the pattern in the template and lead to a decrease in the quality of future imprinted substrates using this template and prevent re-use of the template. The nanoimprint template 252 may be treated with specific surface chemistry to facilitate re-use. This surface chemistry may decrease the adhesion between the nanoimprint template and the cured resin, without interfering with the displacement of the resin prior to the curing. Furthermore, the specific treatment may change based on the material of the nanoimprint template 252. The nanoimprint template 252 may be manufactured with an UV-transparent material, such as fused silica, or an elastomer, such as a PDMS. Other appropriate materials may be used to manufacture the nanoimprint template 252. Note also that, if the curing step 260 employs UV radiation, a UV-transparent material is used to produce the nanoimprinting template 252.

Figure 15:
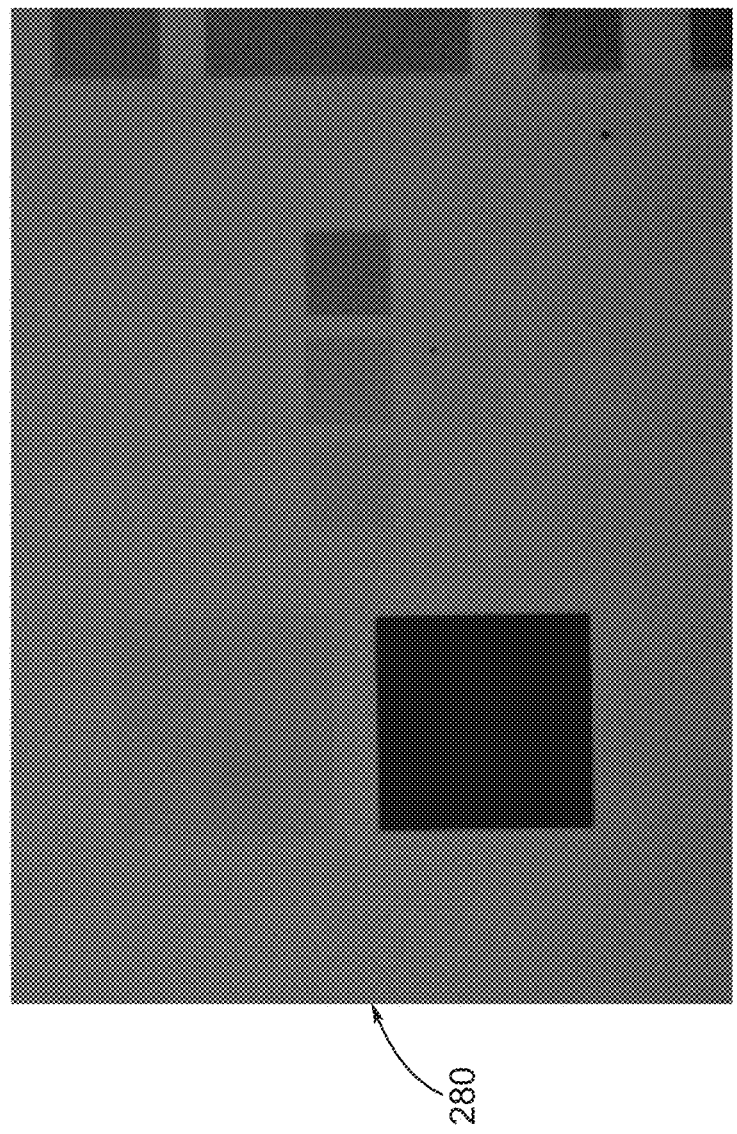
FIG. 15 is an image of imprinted structures in a glass substrate produced with a low residue nanoimprinting method, according to examples of the present disclosure.

The image 280 in FIG. 15 illustrates imprinted regions produced as a result of the displacement-based method. The lighter regions are residue-free regions that may be employed for bonding or for other applications. The dark squares are imprinted areas produced by the template 252. Darker squares correspond to taller structures, whereas the lighter squares correspond to shorter nanostructures.

Several examples of the method have been described. One example of the method (similar to the method shown in FIG. 4) to produce an imprinted residue-free substrate surface comprises coating a substrate layer (e.g., 82) with a layer of imprinting resin (e.g., 84); applying a nanoimprinting template to create nanostructures in the imprinting resin; curing the imprinting resin with the nanoimprinting template in place to produce a cured imprinting resin; removing the nanoimprinting template; applying a first sealing layer (e.g., 86) to a top surface of the cured imprinting resin; welding a region of the cured imprinting resin in contact with a bonding region of the substrate layer; and removing the first sealing layer welded to the region of the cured imprinting resin in contact with the bonding region of the substrate layer.

In this example method, removing the first sealing layer generates one or more residue-free regions (e.g., 94) on a surface of the substrate layer. In one example, these one or more residue-free regions are disposed about a perimeter of the substrate layer. In another example, these one or more residue-free regions substantially surround the nanostructures formed by the nanoimprinting template.

In one example of this method, the imprinting resin is a liquid resin, and the curing of the imprinting resin comprises exposing the liquid resin to an ultraviolet (UV) light source. In another example of this method, curing the imprinting resin comprises increasing a temperature of the imprinting resin; and decreasing the temperature of the imprinting resin after a curing time has elapsed.

In one example of this method, the coating of the substrate layer with the imprinting resin comprises a spin coating technique.

In another example of this method, the first sealing layer is a gasket.

Also in this example of the method, welding of the region comprises applying energy only to a region (of the cured imprinting region) in contact with the bonding region and not other regions of the cured imprinting resin.

This example of the method may also comprise applying a second sealing layer to the top surface of the cured imprinting resin after removing the first sealing layer. This example may also comprise welding the second sealing layer to a residue-free region of the substrate layer. This example may also comprise removing the second sealing layer.

Another example of the method (similar to the method shown in FIG. 9) for producing an imprinted substrate surface comprises forming nanostructures in a resin layer (e.g., 84); applying a first photoresist layer to a top surface of the resin layer; applying a photolithography mask to a top surface of the first photoresist layer; exposing the first photoresist layer to a light source through the photolithography mask; removing the photolithography mask; developing the first photoresist layer to produce a protective photoresist (e.g., 184); etching the photoresist and regions of the resin layer without the nanostructures using an etching technique; and removing the protective photoresist.

In this example of the method, forming nanostructures in the resin layer comprises coating a substrate layer with a layer of imprinting resin; applying a nanoimprinting template to create nanostructures in the imprinting resin; curing the imprinting resin with the nanoimprinting template in place to produce a cured imprinting resin; and removing the nanoimprinting template.

In one example of this method, the photolithography mask, a photoresist material of the photoresist layer, and the photolithography developing technique are a chosen to perform a positive photolithography technique. In another example of this method, the photolithography mask, a photoresist material of the photoresist layer, and the photolithography developing technique are a chosen to perform a negative photolithography technique.

In one example of this method, the photoresist layer comprises a NR-9 photoresist material and the light source is an ultraviolet (UV) light source.

In one example of this method, the etching technique comprises a dry etching technique. In another example of this method, the etching technique is a reactive ion etching technique. In still another example of this method, the etching technique comprises a wet etching technique. The wet etching technique may be an acid etching technique. Alternatively, the wet etching technique may be an alkaline etching technique.

An example of this method further comprises applying a surface chemistry treatment to the resin layer. In an example, applying the surface chemistry treatment precedes the application of the first photoresist layer. In another example, applying the surface chemistry treatment follows the removal of the protective photoresist.

In an example of this method, the protective photoresist is removed using a stripping method.

Still another example of the method (similar to the method shown in FIG. 14) to produce an imprinted substrate surface comprisescoating a substrate layer (e.g., 82) with an imprinting resin layer (e.g., 254A); applying a nanoimprinting template to the imprinting resin layer, the nanoimprinting template (e.g., 252) comprising: a nanostructure template to mold nanostructures in the imprinting resin; and a residue-free template to create residue-free regions in the substrate layer; curing the imprinting resin layer with the nanoimprinting template in place to produce a cured imprinting resin; and removing the nanoimprinting template.

In an example of this method, the residue-free template of the nanoimprinting template comprises channels to facilitate displacement of resin from the imprinting resin layer. In another example of this method, the nanoimprinting template is treated such that it does not contain resin residues following the removing of the nanoimprinting template.

In an example of this method, the imprinting resin comprises a polyimide resin, the nanoimprinting template comprises UV transparent material, and the curing of the imprinting resin comprises exposing the imprinting resin to an UV light.

In still another example of this method, the residue-free template of the nanoimprinting template comprises one or more contact surfaces configured to form an uninterrupted contact region with the substrate layer.

In some examples, this method further comprises etching the nanostructures to a desired height.

Any of the examples of the method disclosed herein may be used to form a flow cell (e.g., 10, 10A). In an example, the flow cell comprises a first substrate layer (e.g., 41, 20) comprising at least one imprinted nanostructure (e.g., 46A) and a first residue-free region (52A); a second substrate layer (e.g., 22); a gasket layer (e.g., 14), wherein the gasket layer is bonded to the first substrate layer in the first residue-free region via a first bond and the gasket layer is bonded to the second substrate layer via a second bond; and at least one sealed chamber (e.g., 12) wherein each sealed chamber is formed by a volume between the first substrate layer, the second substrate layer, a negative space within the gasket, or any combination thereof; and wherein the at least one sealed chamber supports a pressure of at least 1 psi.

In an example of the flow cell, the first substrate layer is a glass layer.

In an example of the flow cell, the gasket layer is a bondable thermoplastic polyimide film layer.

In an example of the flow cell, the second substrate layer has imprinted nanostructures and a second residue-free region, and wherein the gasket layer is bonded to the second substrate layer in the second residue-free region.

In an example of the flow cell, the at least one imprinted nanostructure comprises a polyimide resin.

In an example of the flow cell, the at least one imprinted nanostructure has a surface chemistry. In another example of the flow cell, the first substrate layer has a surface chemistry.

In an example of the flow cell, the first residue-free region of the first substrate layer comprises at least 99% of a surface area free of a residue from a nanoimprinting material.

In an example of the flow cell, the first bond has a minimum adhesion strength of 1000 gF.

In an example of the flow cell, the first residue-free region is produced using a peeling technique. In another example of the flow cell, the first residue-free region is produced using a selective etching technique. In still another example of the flow cell, the first residue-free region is produced using a low-residue nanoimprinting lithography technique.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range. For example, a range from about 400 nm to about 1 µm, should be interpreted to include not only the explicitly recited limits of from about 400 nm to about 1 µm, but also to include individual values, such as about 580 nm, about 725 nm, about 885.5 nm, etc., and sub-ranges, such as from about 550 nm to about 950 nm, from about 475 nm to about 800 nm, etc. Furthermore, when "about" and/or "substantially" are/is utilized to describe a value, they are meant to encompass minor variations (up to +/−10%) from the stated value.

While only certain features of the contemplated examples have been illustrated and described herein, many modifications and changes will occur to those skilled in the art. Further, it should be understood that certain elements of the disclosed examples may be combined or exchanged with one another. As such, it should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It is, therefore, to be further understood that the appended claims are intended to cover all such modifications and changes as fall within the true spirit of the disclosure.

The invention claimed is:

1. A flow cell, comprising:
    a resin structure including a plurality of imprinted nanostructures that are separated by surfaces of the resin structure;
    a first glass substrate layer supporting the resin structure, the first substrate layer comprising a first residue-free region surrounding the resin structure;
    a second glass substrate layer;
    a polyimide gasket layer, wherein the polyimide gasket layer is bonded directly to the first glass substrate layer in the first residue-free region via a first bond and the polyimide gasket layer is bonded to the second glass substrate layer via a second bond; and
    at least one sealed chamber defined between the first glass substrate layer, the second glass substrate layer, and the polyimide gasket;
    wherein the at least one sealed chamber supports a pressure of at least 1 psi.

2. The flow cell of claim 1, wherein the resin structure is a polyimide resin.

3. The flow cell of claim 1, further comprising a second resin structure supported by the second glass substrate layer, wherein the second resin structure includes a second plurality of imprinted nanostructure that are separated by surfaces of the second resin structure, and wherein the second glass substrate layer comprises a second residue-free region surrounding the second resin structure.

4. The flowcell of claim 3, wherein the polyimide gasket layer is directly bonded to the second glass substrate layer in the second residue-free region.

5. The flow cell of claim 1, wherein each of the plurality of imprinted nanostructures has a surface chemistry applied thereto.

6. The flow cell of claim 1, wherein the first residue-free region of the first glass substrate layer comprises at least 99% of a surface area free of a residue from the resin structure.

7. The flow cell of claim 1, wherein the first bond has a minimum adhesion strength of 1000 gF.

* * * * *